(12) United States Patent
Tanaka et al.

(10) Patent No.: US 7,138,282 B2
(45) Date of Patent: Nov. 21, 2006

(54) CORRECTING DEVICE, EXPOSURE APPARATUS, DEVICE PRODUCTION METHOD, AND DEVICE PRODUCED BY THE DEVICE PRODUCTION METHOD

(75) Inventors: Nobuyoshi Tanaka, Tokyo (JP); Eiji Sakamoto, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 36 days.

(21) Appl. No.: 11/125,082

(22) Filed: May 10, 2005

(65) Prior Publication Data
US 2005/0195377 A1 Sep. 8, 2005

Related U.S. Application Data

(62) Division of application No. 10/011,210, filed on Dec. 11, 2001, now Pat. No. 6,951,766.

(30) Foreign Application Priority Data
Dec. 22, 2000 (JP) ............................. 2000-391573

(51) Int. Cl.
*H01L 21/00* (2006.01)
(52) U.S. Cl. .................. 438/12; 355/53; 250/397; 250/453.1
(58) Field of Classification Search .................. 438/12; 355/53; 250/397, 453.1
See application file for complete search history.

(56) References Cited

U.S. PATENT DOCUMENTS

| | | | |
|---|---|---|---|
| 4,786,947 A | 11/1988 | Kosugi et al. | ............... 355/30 |
| 5,093,579 A | 3/1992 | Amemiya et al. | ........ 250/453.1 |
| 5,138,643 A | 8/1992 | Sakamoto et al. | ............ 378/34 |
| 5,231,291 A | 7/1993 | Amemiya et al. | ........ 250/443.1 |
| 5,892,572 A | 4/1999 | Nishi | ........................... 355/67 |
| 5,997,963 A | 12/1999 | Davison et al. | ............. 427/582 |
| 6,097,790 A | 8/2000 | Hasegawa et al. | .......... 378/161 |
| 6,133,982 A | 10/2000 | Inoue et al. | .................. 355/30 |
| 6,341,006 B1 | 1/2002 | Murayama et al. | ........... 355/53 |
| 6,951,766 B1 | 10/2005 | Tanaka et al. | ................ 438/12 |
| 2002/0057422 A1 | 5/2002 | Arakawa | ...................... 355/30 |

FOREIGN PATENT DOCUMENTS

| | | |
|---|---|---|
| JP | 6-176408 | 6/1994 |
| JP | 10-214780 | 8/1998 |

*Primary Examiner*—W. David Coleman
(74) *Attorney, Agent, or Firm*—Fitzpatrick, Cella, Harper & Scinto

(57) ABSTRACT

A correcting device that properly maintains the flatness of a mask, an exposure apparatus in which overlay accuracy is increased by making use of the correcting device, and a device production method. The correcting device includes a gas flow path including a first area and a second area. The first area is formed above a reticle having formed thereon a pattern that is projected onto a material to be processed in order to form an image of the pattern on the material to be processed. The second area is connected to the first area, has a cross-sectional area that is different from that of the first area, and is not disposed in line with the reticle. The correcting device also includes a blowing section that blows gas to the gas flow path.

18 Claims, 13 Drawing Sheets

CORRECTING DEVICE, EXPOSURE APPARATUS, DEVICE PRODUCTION METHOD, AND DEVICE PRODUCED BY THE DEVICE PRODUCTION METHOD

This application is a divisional application of patent application Ser. No. 10/011,210, filed on Dec. 11, 2001 now U.S. Pat. No. 6,951,766.

BACKGROUND OF THE INVENTION

1. Field of the Invention

In general, the present invention relates to an exposure apparatus. More particularly, the present invention relates to an exposure apparatus used to expose a material to be processed, such as a monocrystalline substrate for a semiconductor wafer or a glass substrate for a liquid crystal display (LCD), a correcting device that corrects deformation of a mask or a reticle (hereafter, these terms are used interchangeably in the application) used in the exposure apparatus, a device production method using the material to be processed, and a device that is produced from the material to be processed. The present invention is, for example, suitable for application to an exposure apparatus which exposes a monocrystalline substrate for a semiconductor wafer by the step-and-scan projection method, the scan projection method, or the step-and-repeat projection method in a photolithography process.

Here, the step-and-scan projection method is a projection exposure method in which a wafer is continuously scanned in synchronism with a scanning movement of a mask or a reticle in order to project a pattern of the mask onto the wafer by exposure, after which, after completion of an exposure of one shot, the wafer is moved stepwise in order to move the next shot to an exposure area. The scan projection method is a projection exposure method in which a portion of the mask pattern is projected onto the wafer by a projection optical system and the mask and a material to be processed are scanned in synchronism with each other with respect to the projection optical system in order to project the whole mask pattern onto the wafer by exposure. The step-and-repeat projection method is a projection exposure method in which the wafer is moved stepwise with each full exposure of a shot of the wafer in order to move the next shot to the exposure area.

2. Description of the Related Art

In recent years, the demand for smaller and thinner electronic devices has caused an increasing demand for finer semiconductor devices installed in the electronic devices. For example, it is expected that design rules of a mask pattern will become increasingly smaller in the future as a result of an attempt to realize a line and space (L & S) of 130 nm in a mass production line. L & S refers to an image projected onto a wafer during exposure with the widths of the lines and spaces being equal, so that it is a measure of exposure resolution. In the exposure, resolution, overlay accuracy, and throughput are three important parameters. Resolution is defined as the smallest dimension that can be precisely transferred. Overlay accuracy is defined as the accuracy with which several patterns are overlaid on a material to be processed. Throughput is the number of materials that are processed per unit time.

There are basically two types of exposure methods, a 1× magnification transfer method and a projection method. The 1× magnification transfer method includes a method in which a mask and a material to be processed are brought into contact with each other and a method in which they are separated slightly. However, in the former method, although a high resolution can be obtained, the mask gets damaged and the material to be processed gets scratched or defective due to dust or pieces of silicon being pressed into the mask. In the latter method, the problem that exists in the former method is initially solved, but, when the separation between the mask and the material to be processed becomes smaller than the maximum size of dust particles, damage to the mask similarly occurs.

To overcome the problem that the mask and the material to be processed become damaged, a projection method in which the mask and the material to be processed are further separated has been proposed. Of the different types of projection methods, the projection method that uses a scanning projection exposure apparatus is in dominant use in recent years in order to improve resolution and to increase the size of an exposure area. In this projection method, the mask is exposed a portion at a time, and the mask and the wafer are caused to be in synchronism with each other. By scanning the wafer either continuously or intermittently, the entire mask pattern is projected onto the wafer by exposure.

In general, a projection exposure apparatus comprises an illumination optical system that illuminates a mask and a projection optical system, disposed between the mask and a material to be processed, which projects a circuit pattern of the mask that has been illuminated onto the material to be processed. In the illumination optical system, in order to obtain a uniform illumination area, light beams from a light source are made to enter a light integrator comprising, for example, fly's eye lenses that are provided using a plurality of rod lenses. With a light-exiting surface of the light integrator being used as a secondary light source surface, these light beams that have entered the light integrator are used to subject a mask surface to Koehler illumination through a condenser lens.

However, when the optical axis substantially coincides with the direction of gravitational force, the center portion of the mask is flexed by an amount on the order of a few microns in the direction of the gravitational force due to its own weight, resulting in a problem that overlay accuracy is reduced during the exposure. More specifically, the following problems arise: (1) Distortion of a projected image of the pattern changes as a result of distortion of the mask pattern, and (2) focal depth, which is the focal range that allows a certain image-formation performance to be maintained, is reduced by curvature of field. In particular, it is expected that due to the recent demand for finer patterns, even a slight variation in the pattern must be increasingly taken into account in the future.

To overcome such problems, Japanese Patent Laid-Open No. 10-214780 proposes, in a first embodiment, to enclose a mask in order to apply static pressure to a hermetically sealed space through a pressure control device. However, when the mask is enclosed, heat produced by exposure causes the mask to be distorted, so that this method is not a preferable method. In addition, the same document proposes, in a second embodiment, to correct the distortion of the mask through a piezoelectric device disposed around the mask. However, the use of the piezoelectric device around the mask is not necessarily effective in removing flexure of the center portion of the mask caused by its own weight.

Japanese Patent Laid-Open No. 6-176408 proposes to supply gas having a predetermined pressure to a mask from a direction opposite to the direction in which the mask flexes. However, it is difficult to uniformly apply pressure to the mask. In addition, it is difficult to dispose gas blowing means while maintaining an exposure optical system.

SUMMARY OF THE INVENTION

In general, it is an object of the present invention to provide a novel, useful correcting device, exposure apparatus, device production method, and device produced by the production method, which make it possible to overcome these conventional problems.

More specifically, it is an object of the present invention to provide, for illustrative purposes, a correcting device that properly maintains the flatness of a mask, and an exposure apparatus and a device production method, which make it possible to increase overlay accuracy by making use of the correcting device.

It is another object of the present invention to provide, as for different illustrative purposes, devices, such as a high-quality semiconductor, a liquid crystal device (LCD), a charge-coupled device (CCD), and a thin-film magnetic head, which are produced by the device production method.

To overcome the above-described problems, according to a first aspect, the present invention provides a correcting device comprising a gas flow path including a first area and a second area, the first area being formed above a reticle having formed thereon a pattern that is projected onto a material to be processed in order to form an image of the pattern on the material to be processed, and the second area being connected to the first area, having a cross-sectional area that is different from that of the first area, and not being disposed in line with the reticle; and a blowing section that blows gas to the gas flow path.

According to this correcting device, by blowing gas (e.g., air or nitrogen) to a gas flow path having two continuously formed areas, such as a first area and a second area, having different cross-sectional areas, a difference in pressure between the first area and the second area can be produced by making use of Bernoulli's theorem. By properly making use of the pressure difference, the correcting device can correct distortion caused by factors other than the self-weight of the reticle. In addition, the correcting device can restrict a rise in temperature of the reticle caused by exposure heat by cooling the reticle as a result of blowing air onto it.

When a third area is provided upstream from the first area in terms of the gas that is blown, and when the cross-sectional area of the third area is greater than the cross-sectional area of the first area, it is possible to reduce the temperature of the gas in the first area, so that the rise in temperature of the reticle caused by the exposure heat can be more efficiently reduced.

When the structure of the first aspect is used, the correcting device may further comprise a smoothing section, disposed between the first and second areas, for smoothing movement of the gas between the first and second areas. Accordingly, the smoothing section can prevent the gas from deviating from Bernoulli's theorem caused by the gas swirling between the first and second areas. The gas flow path may be provided opposite to the material to be processed with regard to the reticle. In general, since a pellicle film is provided at the side of the material to be processed, by providing the gas flow path opposite to the material to be processed with regard to the reticle, it is possible to prevent deformation of and damage to the pellicle film caused by air blowing across or onto the pellicle film.

When the structure of the first aspect is used, the correcting device may further comprise a control section that controls the blowing section so that, when the density of the gas is p, the weight of the reticle is G, the area of projection of the reticle is $A_R$, the cross-sectional area of the first area is $A_1$, the pressure of the gas in the first area is $P_1$, the velocity is $V_1$, the cross-sectional area of the second area is $A_2$, and the pressure of the gas in the second area is $P_2$, the following formula is satisfied:

$$P_1 - P_2 = 0.5 \cdot \rho \cdot V_1^2 \cdot \{(A_1/A_2)^2 - 1\} = -G/A_R.$$

By virtue of this structure, the correcting device can correct the distortion caused by the self-weight of the reticle. $P_2$ may be set at atmospheric pressure. When the second area is set at atmospheric pressure and the space around the reticle is open, as disclosed in the first embodiment illustrated in Japanese Patent Laid-Open No. 10-214780, the exposure heat is no longer confined in the area around the rectricle, so that the temperature rise of the reticle can be restricted.

According to a second aspect, the present invention provides a correcting device comprising a blowing section that blows gas onto a reticle having formed thereon a pattern to be projected onto a material to be processed in order to form an image of the pattern on the material to be processed; a detecting section that detects pressure at front and back surfaces of the reticle and produces a detection result; and a control section that controls the blowing section so that a difference between the pressures is maintained to be a predetermined value, after receiving the detection result provided by the detecting section. The correcting device can correct the distortion of the reticle because the pressure difference at the front and back surfaces of the reticle is controlled by the control section so that it becomes a predetermined value (for example, a value that cancels the deformation caused by the weight of the reticle due to gravitational force).

According to a third aspect, the present invention provides a correcting device comprising a blowing section that blows gas onto a reticle having formed thereon a pattern to be projected onto a material to be processed in order to form an image of the pattern on the material to be projected; a detecting section that detects a flexure amount of the reticle and produces a detection result; and a control section that controls the blowing section so that the flexure amount is zero after receiving the detection result provided by the detecting section. The correcting device can correct the distortion of the reticle because feedback is controlled by the control section so that the flexure amount of the reticle is zero.

The control sections of these correcting devices can, for example, control the gas speed and the temperature of the gas at the blowing section.

According to a fourth aspect, the present invention provides an exposure apparatus comprising any one of the above-described correcting devices, an illumination optical system that illuminates the pattern, and a projection optical system that projects the pattern onto the material to be processed in order to form an image of the pattern on the material to be processed. The exposure apparatus can provide the operations of any one of the above-described correcting devices.

According to a fifth aspect, the present invention provides a method of producing a device comprising the steps of blowing gas to a gas flow path including a first area and a second area, the first area being formed above a reticle having formed thereon a pattern that is projected onto a material to be processed in order to form an image of the pattern on the material to be processed, and the second area being connected to the first area, having a cross-sectional area that is different from that of the first area, and not being disposed in line with the reticle; subjecting the material to be processed to a projection exposure operation using the reticle; and performing a predetermined processing operation on the material that has been subjected to the projection exposure operation. The device production method, which is carried out by the same operations as those of the exposure apparatus as a result of the blowing step, is used to provide devices, which are intermediate or final products. The device production method may further comprise the step of detecting distortion of the reticle and the step of controlling the blowing of the gas so that the distortion of the reticle is reduced based on a result provided by the detection. By the control operation step, the distortion of the reticle can be corrected with high precision. Examples of such devices are semiconductor chips used, for example, for large-scale integration (LSI) or very large-scale integration (VLSI), charge-coupled devices (CCDs), liquid crystal devices (LCDs), magnetic sensors, and thin-film magnetic heads.

Further objects, features and advantages of the present invention will become apparent from the following description of the preferred embodiments with reference to the attached drawings.

DESCRIPTION OF THE PREFERRED EMBODIMENTS

Figure 1:
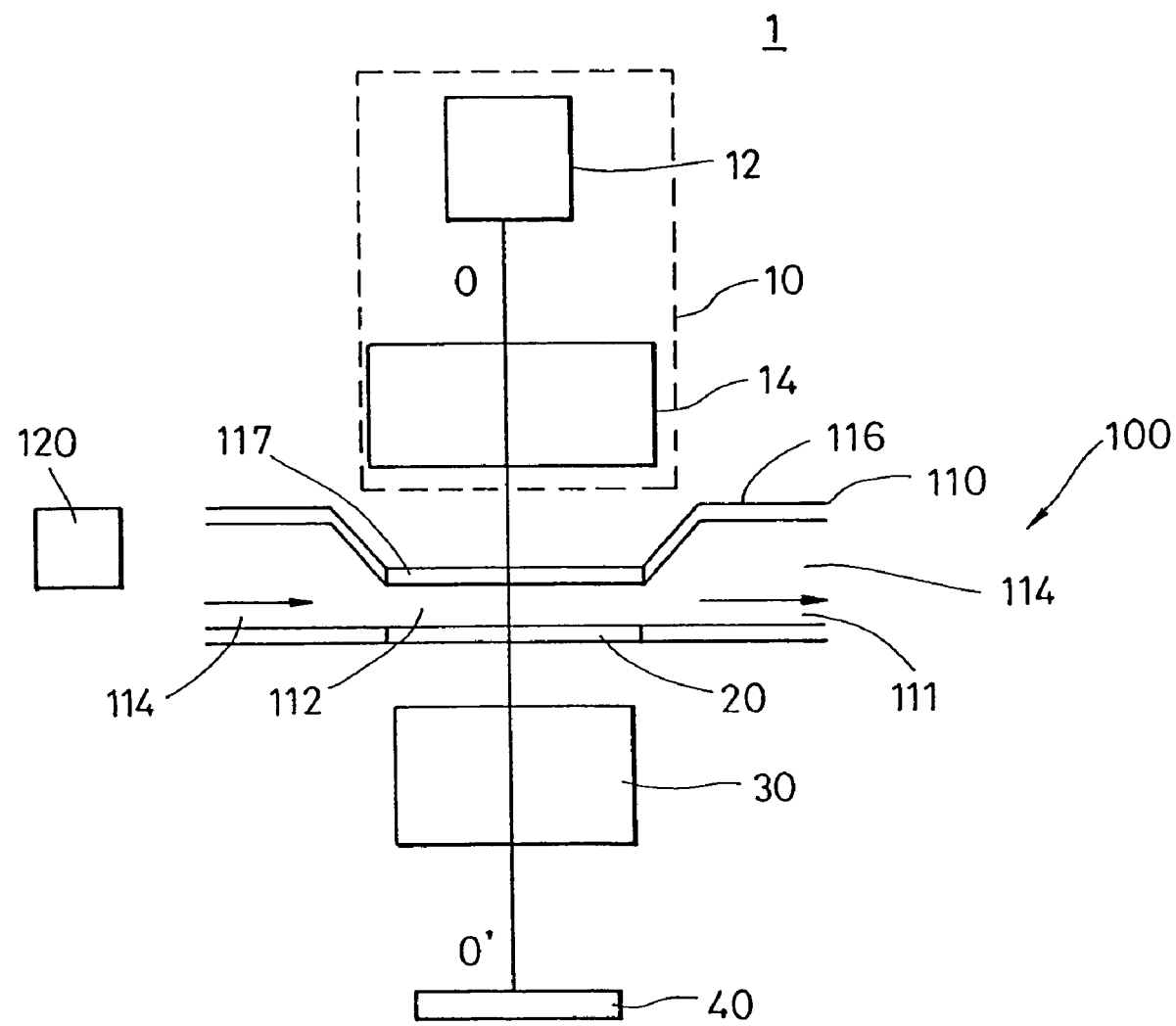
FIG. 1 is a block diagram of an exposure apparatus of an embodiment of the present invention.

Hereafter, for illustrative purposes, an exposure apparatus 1 of the present invention will be described with reference to the attached drawings. FIG. 1 shows an optical path of a simplified optical system of the illustrative exposure apparatus 1 of the present invention.

As shown in FIG. 1, the exposure apparatus 1 comprises an illumination device 10, a reticle 20, a projection optical system 30, a plate 40, and a correcting device 100. The exposure apparatus 1 is a scanning projection exposure apparatus which, by exposure, projects a circuit pattern formed on the reticle 20 onto the plate 40 by the step-and-repeat projection exposure method or the step-and-scan projection exposure method.

The illumination device 10 illuminates the reticle 20 on which the circuit pattern to be transferred is formed, and comprises a light source 12 and an illumination optical system 14.

For the light source 12, a laser may be used. For the laser, an ArF excimer laser having a wavelength of approximately 193 nm, a KrF excimer laser having a wavelength of approximately 248 nm, or an $F_2$ excimer laser having a wavelength of approximately 153 nm may be used. However, the types of lasers which may be used are not limited to excimer lasers, so that, for example, a yttrium-aluminum-garnet (YAG) laser may be used. The number of lasers used is not limited. When a laser is used as the light source 12, it is preferable to use a light-beam shaping optical system that shapes parallel light beams from the laser light source into beams having desired forms and an optical system that converts coherent laser light beams into incoherent light beams. The types of light sources that can be used as the light source 12 are not limited to lasers, so that one or a plurality of mercury lamps, xenon lamps, etc., may be used.

The illumination optical system 14 illuminates the mask 20, and includes a lens, a mirror, a light integrator, and a stop. For example, a condenser lens, a fly's eye lens, an aperture stop, a condenser lens, a slit, and an image-forming optical system are disposed in that order. The illumination optical system 14 is used regardless of whether the light is axial or oblique light. Examples of the light integrator include integrators formed by placing fly's eye lenses or two sets of cylindrical lens array (or reticular lens) plates upon each other. The light integrator may be replaced by an optical rod or a diffracting device.

A circuit pattern (or image) to be transferred is formed on the reticle 20. Diffraction light coming from the reticle 20 is projected onto the plate 40 through the projection optical system 30. The plate 40 is a material to be processed, such as a wafer or a liquid crystal substrate, and has a resist coated thereto. The reticle 20 and the plate 40 are in a conjugate relationship. In the embodiment, an optical axis OO' shown in FIG. 1 matches the direction of gravitational force. The reticle 20 used in the embodiment is formed of quartz and has a density of approximately 2200 kg/m³, a size of 152 mm in the vertical direction×a size of 152 mm in the horizontal direction×a size of 6.35 mm in the height direction, and a weight of 323 gf (=3.17 N), which is approximately equivalent to a pressure of 140 Pa.

When a scanning projection exposure apparatus is used, the pattern on the mask 20 is transferred onto the plate 40 by scanning the mask 20 and the plate 40 in synchronism with each other. When a stepper (or an exposure apparatus using the step-and-repeat exposure method) is used, exposure is performed while the mask 20 and the plate 40 are stopped.

For the projection optical system 30, there may be used, for example, an optical system comprising only a plurality of lens elements, an optical system (catadioptric optical system) including a plurality of lens elements and at least one concave mirror, an optical system including a plurality of lens elements and at least one diffracting optical element such as a saw-tooth shaped diffracting optical element, or an optical system which is entirely a mirror may be used. When chromatic aberration-needs to be corrected, the projection optical system 30 may be formed using a plurality of lens elements formed of glass materials having different variances (Abbe numbers) or the diffracting optical element may be formed so that scattering occurs in a direction opposite to the lens elements.

The plate 40 is coated with a photoresist. The photoresist applying step consists of a pre-processing operation, an operation for applying an adhesiveness increasing agent, a photoresist applying operation, and a pre-baking operation. The pre-processing operation includes cleaning, drying, and the like. The operation for applying an adhesiveness increasing agent is carried out to modify the surface of the plate 40 (that is, to increase its hydrophobic property by applying a surface active agent), so that the adhesiveness between the photoresist and a base is increased. In the operation for applying an adhesiveness increasing agent, an organic film, such as a hexamethyl-disilazane (HMDS) film, is applied or evaporated. The pre-baking operation is a baking operation, but provides a softer surface than that after development, and is carried out to remove solvent.

The correcting device 100 corrects distortion or flexure of the reticle 20. The reticle 20 is flexed due to its own weight by a few microns in the direction of a gravitational force that is parallel to the optical axis OO' shown in FIG. 1. Therefore, the correcting device 100 first corrects the distortion of the reticle 20 caused by its own weight by making use of Bernoulli's theorem. The correcting device 100 comprises a gas pipe 110, which forms a gas flow path 111, and a blowing section 120, which blows gas to the gas flow path 111. The gas flow path 111 comprises an area 112, which is situated above or below the reticle 20, and an area 114, which is not situated in line with the reticle 20.

Figure 2:
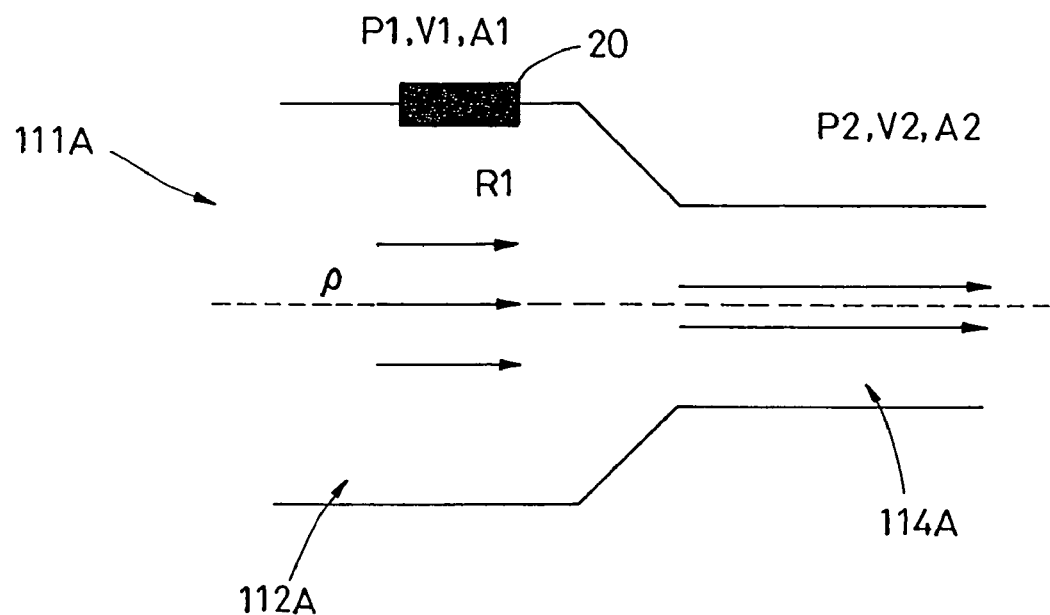
FIG. 2 is a schematic, sectional view used to illustrate the principle of a correcting device of the exposure apparatus shown in FIG. 1.
Figure 3:
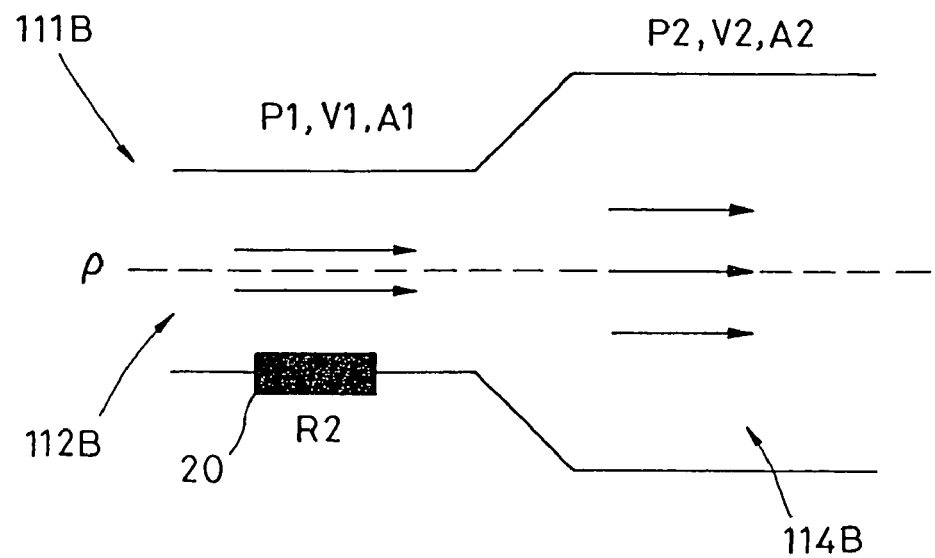
FIG. 3 is a schematic, sectional view used to illustrate the principle of the correcting device of the exposure apparatus shown in FIG. 1.

The principle of the correcting device 100 will be described with reference to FIGS. 2 and 3. Here, FIGS. 2 and 3 are schematic, sectional views used to illustrate the principle of the correcting device 100. FIG. 2 illustrates the case in which a gas flow path 111A is disposed below the reticle 20, and FIG. 3 illustrates the case in which a gas flow path 111B is disposed above the reticle 20. In FIGS. 2 and 3, the arrows represent the directions in which gas flows. The gas flow path 111A (in FIG. 2) comprises a wide area 112A, which is disposed below the reticle 20, and a narrow area 114A, which is not in line with the reticle 20. The gas flow path 111B (in FIG. 3) comprises a narrow area 112B, which is disposed above the reticle 20, and a wide area 114B, which is not in line with the reticle 20. Here, Formula 1 is established from Bernoulli's theorem:

$$\frac{1}{2}V_1^2 + \frac{P_1}{\rho} + gZ_1 = \frac{1}{2}V_2^2 + \frac{P_2}{\rho} + gZ_2 \tag{1}$$

where $\rho$ is the density of the gas flowing in the direction of the arrows shown in FIGS. 2 and 3, $A_1$ is the cross-sectional area of each of the areas 112A and 112B that is perpendicular to the plane of the sheet (FIGS. 2 and 3), $P_1$ is the pressure of the gas in each of the areas 112A and 112B, $V_1$ is the speed of the gas, $Z_1$ is the height from a reference surface at the center of each of the areas 112A and 112B, $A_2$ is the cross-sectional area of each of the areas 114A and 114B that is perpendicular to the plane of the sheet (FIGS. 2 and 3), $P_2$ is the pressure of the gas in the areas 114A and 114B, $V_2$ is the speed of the gas, and $Z_1$ is the height from a reference surface at the center of each of the areas 114A and 114B. Here, since the centers of the areas 112A and 112B and the corresponding areas 114A and 114B coincide, $Z_1=Z_2$. Therefore, Formula 1 becomes Formula 2. When Formula 2 is transformed, it becomes Formula 3.

$$\frac{1}{2}V_1^2 + \frac{P_1}{\rho} = \frac{1}{2}V_2^2 + \frac{P_2}{\rho} \tag{2}$$

$$P_1 - P_2 = 0.5 \times \rho \times (V_2^2 - V_1^2) \tag{3}$$

Since $$V_1 \times A_1 = V_2 \times A_2 \tag{4}$$

$$\text{and } V_2 = \frac{A_1}{A_2}V_1, \tag{5}$$

Formula 6 is established:

$$P_1 - P_2 = 0.5 \cdot \rho \cdot V_1^2 \cdot \{(A_1/A_2)^2 - 1\} \tag{6}$$

When the central lines of the areas 112A and 112B and the corresponding areas 114A and 114B do not coincide, Formula 6 becomes:

$$P_1 - P_2 = 0.5 \times \rho \times V_1^2 \times \{(A_1/A_2)^2 - 1\} + \rho g \times (Z_2 - Z_1).$$

However, when $P_1-P_2$ is on the order of 100 Pa, $\rho \times g \times (Z_2-Z_1)$ is $12.25 \times (Z_2-Z_1)$, so that when $Z_2-Z_1$ is equal to or less than a value on the order of 0.1 (10 cm), Formula 6 produces an error on the order of 10%, which is not a problem from a practical standpoint.

$P_1-P_2$ is a difference in pressure between the areas 112A and 112B and the corresponding areas 114A and 114B. When the gas flow paths 111A and 111B are open to the atmosphere in order to set $P_2$ at atmospheric pressure, it is possible to apply the pressure difference obtained by the above formula against the weight of the reticle 20 (that is, in general, in the embodiment, G=3.17 and $A_R=0.152^2$ when G represents the weight of the reticle and $A_R$ is the area of projection of the reticle 20). By setting $P_2$ at atmospheric pressure and causing the space around the reticle 20 to be open, heat will not be confined in the area around the reticle 20 as it is in the first embodiment disclosed in Japanese Patent Laid-Open No. 10-214780, thereby making it possible to prevent deformation and distortion of the reticle 20 as a result of restricting a temperature rise in the reticle 20.

Figure 4:
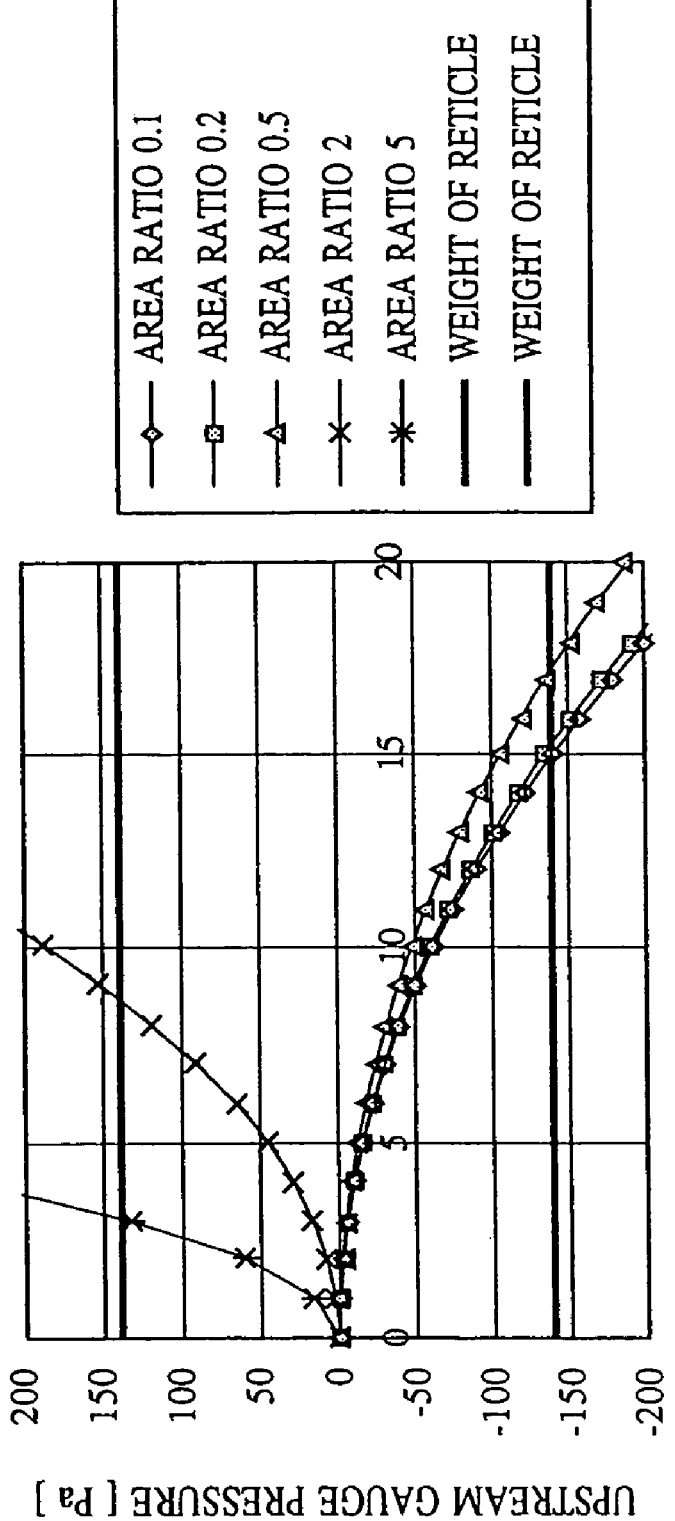
FIG. 4 is a graph showing the relationship between upstream gauge pressure and upstream gas speed in the views shown in FIGS. 2 and 3.

The relationship between $P_1$ (upstream gauge pressure) and $V_1$ (upstream gas speed) is shown in FIG. 4. An area ratio which is greater than one means that the gas flow paths 111A and 111B have shrunk, whereas an area ratio less than one means that they have expanded.

In order to apply a pressure equivalent to the self-weight of the reticle 20 after rewriting Formula 4 using 140 Pa, which is equivalent to the self-weight of the reticle 20, when the gas flow path 111A is contracted (that is, when $A_1 > A_2$), $$V_1 = 15/\{(A_1/A_2)^2 - 1\}^{1/2}$$

On the other hand, when the gas flow path 111B is expanded (that is, when $A_1 < A_2$), $$V_1 = 15/\{1-(A_1/A_2)^2\}^{1/2}$$

Referring to FIGS. 2 and 4, when $A_1/A_2=2$ in the case in which the gas flow path 111A is disposed below the reticle 20, the required gas speed is $V_1=8.7$ m/sec. Similarly, referring to FIGS. 3 and 4, when $A_1/A_2=0.5$ in the case in which the gas flow path 111B is disposed above the reticle 20, the required gas speed is $V_1=8.7$ m/sec.

According to the correcting device 100, by blowing gas, such as air or nitrogen, to the gas flow paths having two continuously formed areas having different cross-sectional areas, a difference in pressure can be produced between both of the areas as a result of making use of Bernoulli's theorem. By properly making use of the pressure difference, the correcting device 100 can correct distortion caused by factors other than the self-weight of the reticle 20. In addition, the correcting device 100 can restrict a temperature rise in the reticle 20, caused by heat of exposure light emitted from the illumination device 10, by cooling the reticle 20 as a result of blowing gas onto the reticle 20.

In FIG. 1, the gas pipe 110, which is recessed above the reticle 20, is used. Therefore, in FIG. 1, the area 114 is provided not only behind the area 112 but also in front of the area 112 (that is, upstream in terms of the gas that is being blown). Since the cross-sectional area of the area 112 is smaller than the cross-sectional area of the upstream-side area 114, the temperature of the gas in the area 112 can be reduced, so that the temperature rise in the reticle 20 caused by the exposure heat can be restricted.

In FIG. 1, the structure shown FIG. 3 can be used instead of the structure shown in FIG. 2. More specifically, the gas pipe 110 is provided opposite to the plate 40 in relation to the reticle 20. In general, a pellicle or a film (not shown) is provided at the plate 40 side. The pellicle is a transparent protective film (or a structural member thereof) provided within a certain distance from the reticle 20 in order to prevent foreign matter from adhering onto the reticle 20. Therefore, by providing the gas pipe 110 opposite to the plate 40 in relation to the reticle 20, it is possible to prevent the reticle 20 from deforming and breaking, when gas flows, by using the pellicle, so that the reticle 20 can be indirectly protected.

Figure 5:
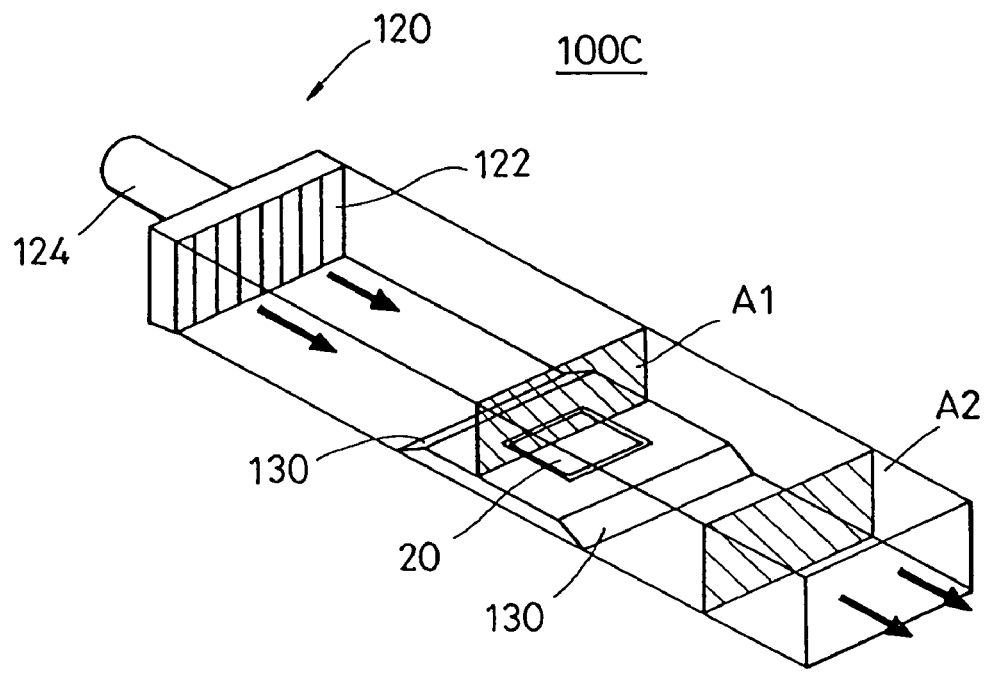
FIG. 5 is a perspective view of a modification of the correcting device shown in FIG. 1.
Figure 6:
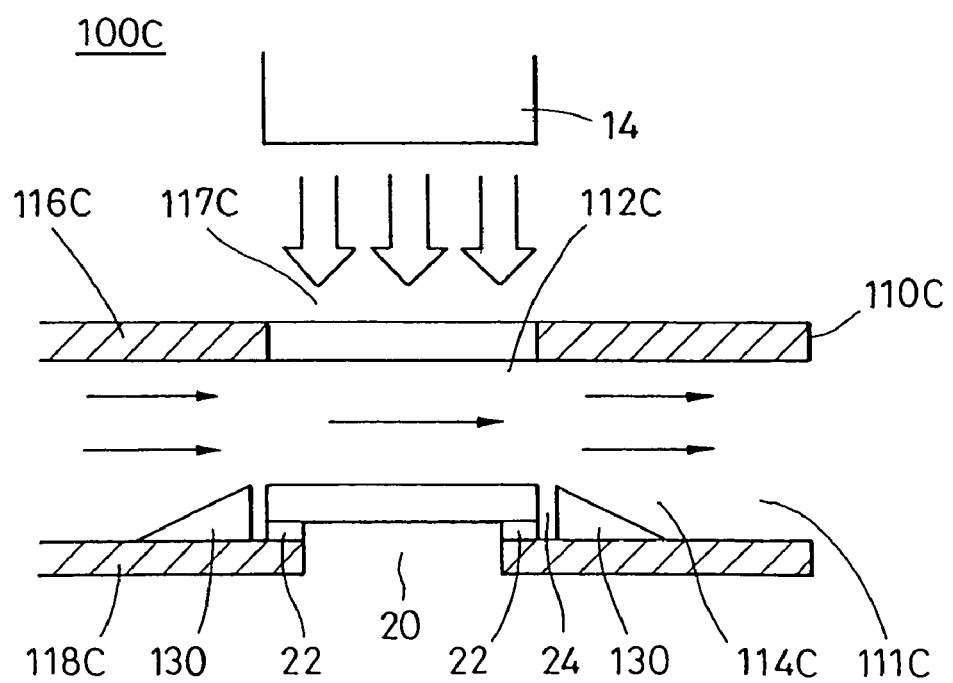
FIG. 6 is a sectional view of the correcting device shown in FIG. 5.
Figure 7:
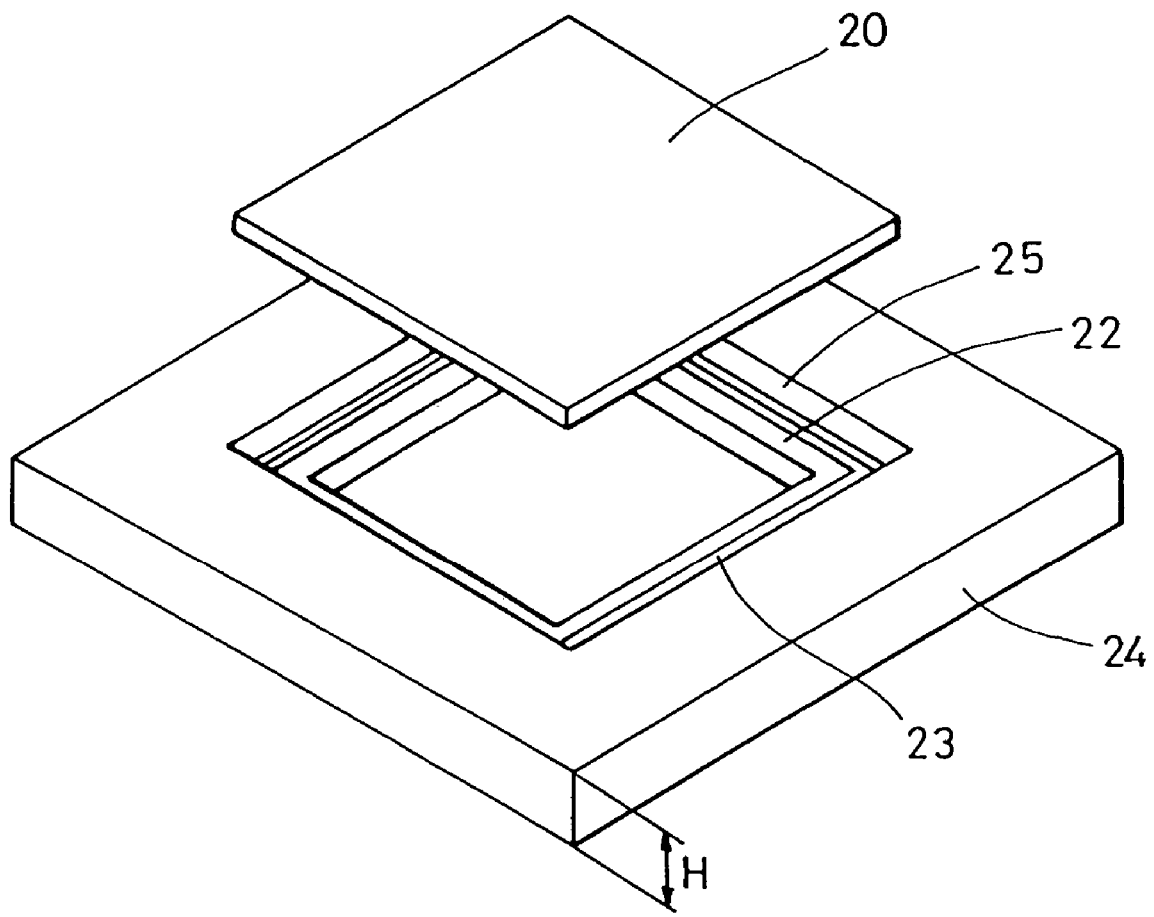
FIG. 7 is an exploded perspective view used to illustrate a method of setting a reticle usable in the correcting device shown in FIG. 5.

The structures of the gas pipe 110 and the reticle 20 shown in FIG. 1 are merely examples. For example, as shown in FIGS. 5 and 6, a correcting device 100C, including a gas pipe 110C defined by a gas flow path 111C, having areas 112C and 114C, may be formed by a pair of cross-sectionally parallel surfaces 116C and 118C in order to cause the reticle 20 to protrude from a bottom surface 118C (or a reticle table) of the gas pipe 110. Here, FIG. 5 is a perspective view of a modification of the correcting device shown in FIG. 1, and FIG. 6 is a sectional view thereof. As shown in FIG. 7, the reticle 20 is secured to a reticle chuck 22 through a vacuum hole 23 formed at the reticle chuck 22, which is accommodated in a rectangular hole 25 formed in the center of a rectangular reticle stage 24. By properly setting a height H of the reticle stage 24, a cross-sectional area $A_1$ of the area 112C shown in FIG. 5 is determined. A cross-sectional area $A_2$ of the area 114C is defined by the pair of parallel surfaces 116C and 118C of the gas pipe 110C.

The blowing section 120 shown in FIG. 1 blows gas, whose temperature is controlled at a certain temperature, towards the scanning direction of the reticle stage 24. For example, as shown in FIG. 5, the blowing section 120 includes a filter 122 and a duct 124. For the gas, air may be used when the light source 12 is a mercury lamp, while nitrogen or the like may be used when the light source 12 is a laser. The filter 122 is provided at the exit of the blowing section 120 and cleans the gas that blows from the blowing section 120. For the filter 122, a HEPA (manufactured by Nippon Cambridge Filter Co., Ltd.) may be used. The duct 124 is connected to an external gas source (not shown) in order to cause the gas to flow into the blowing section 120.

The gas pipe 110 shown in FIG. 1 includes a transmission window 117, formed of a material such as glass that passes exposure light from the illumination optical system 14, at a top surface 116 thereof.

As shown in FIG. 6, it is preferable for the correcting device 100 to further include a smoothing section 130, disposed between the areas 112C and 114C, which smooths the movement of the gas flowing therebetween. The smoothing section 130 can prevent the gas from deviating from Bernoulli's theorem, which would be caused by the gas swirling between the areas 112C and 114C. Although in the embodiment the smoothing section 130 is formed by a triangular column that is provided at the upstream side and the downstream side of the reticle stage 24, an inclined portion does not have to take the form of a straight line as in the embodiment. It may take any form, such as a curved form or an arcuate form, as long as it can smooth the movement of the gas.

Figure 8:
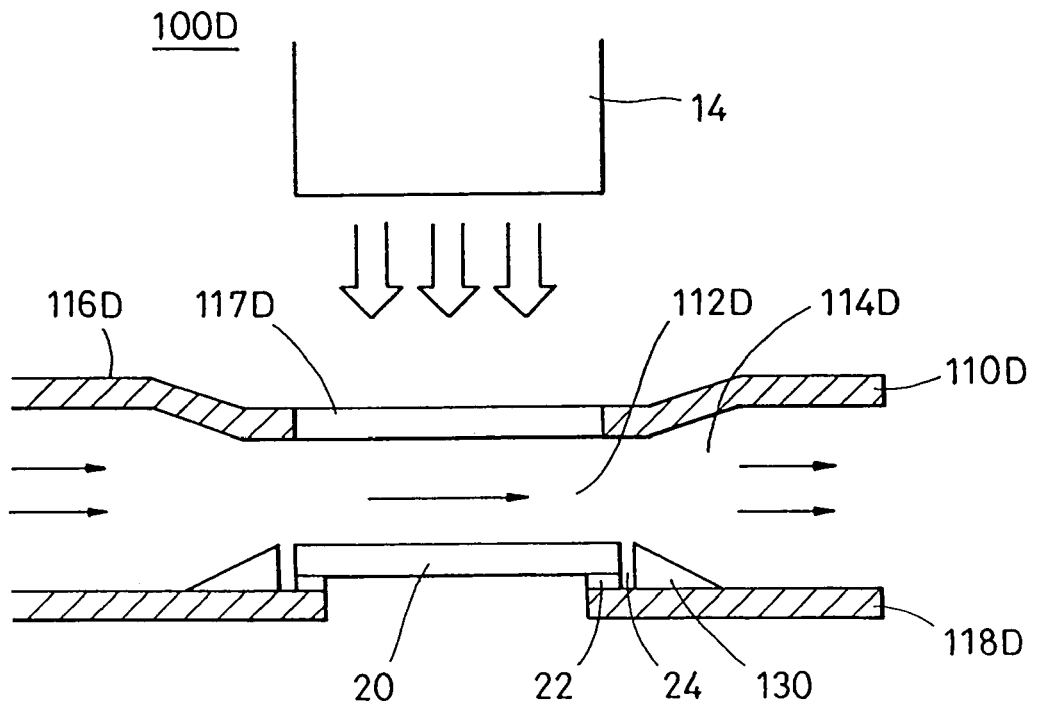
FIG. 8 is a sectional view of another modification of the correcting device shown in FIG. 1.

FIG. 8 illustrates a correcting device 100D, which is a modification of the correcting device shown in FIG. 1, in which, similar to the gas pipe 110 shown in FIG. 1, a gas pipe 110D, which is recessed above the reticle 20, is formed at a top surface 116D. In the modification, due to the depth of the recess in the top surface 116D, the cross-sectional area of an area 112D can be adjusted. Accordingly, this modification has the feature that a height H of the reticle stage 24 shown in FIG. 7 does not have to be set at so high a value.

Figure 9:
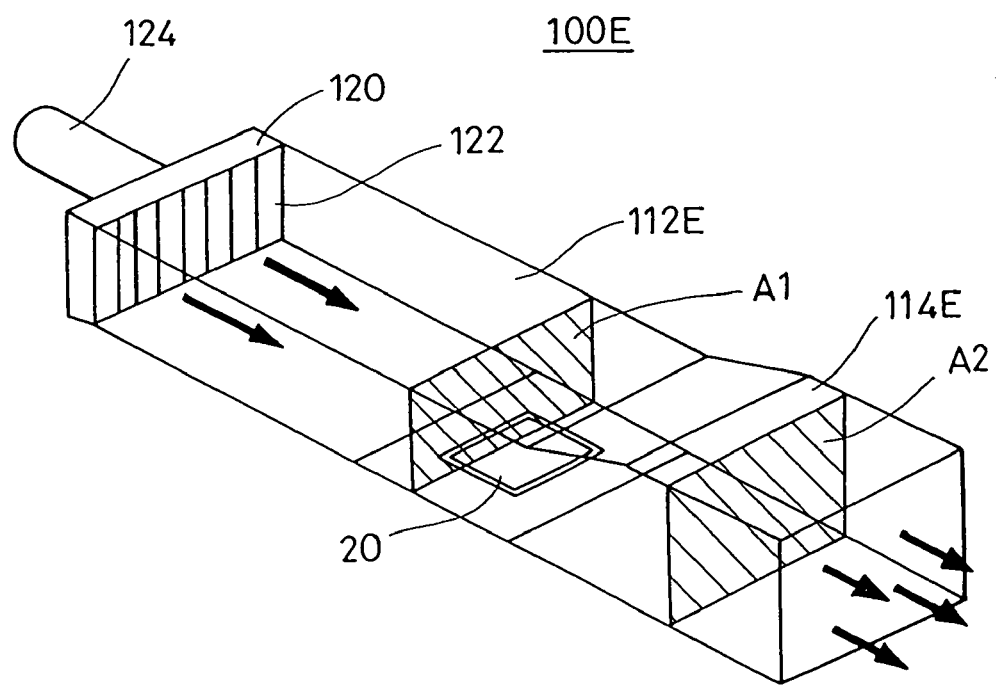
FIG. 9 is a perspective view of still another modification of the correcting device shown in FIG. 1.
Figure 10:
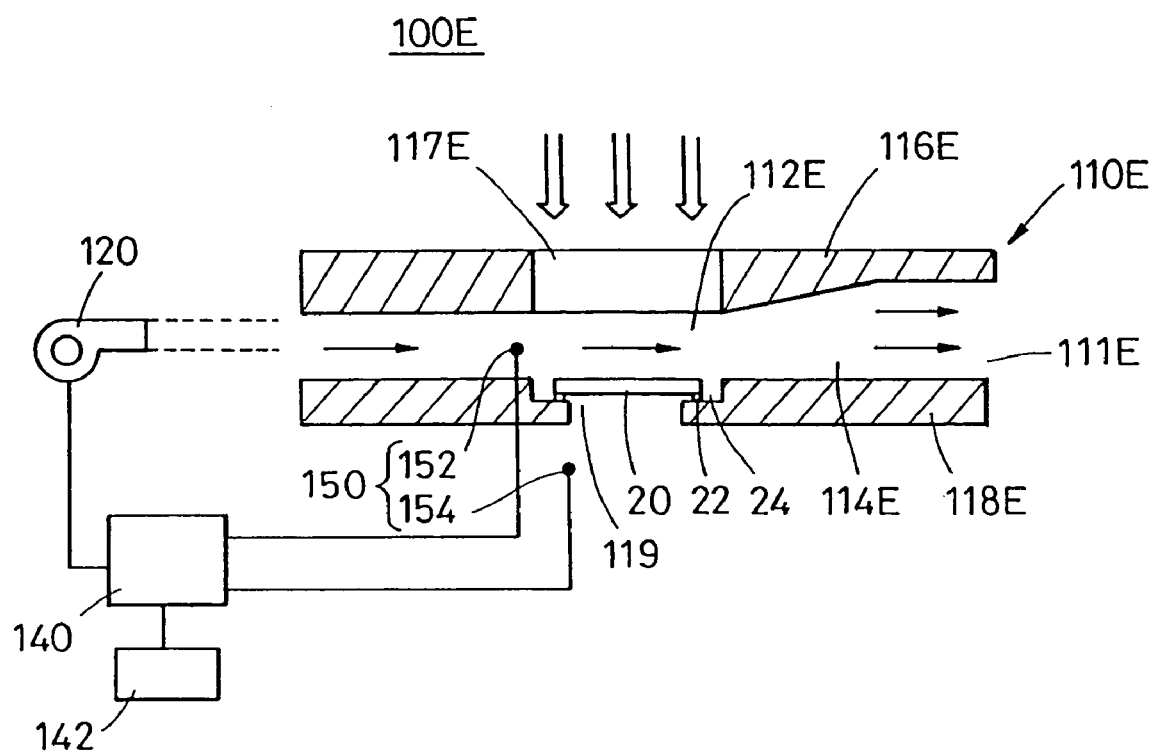
FIG. 10 is a sectional view of the correcting device shown in FIG. 9.

FIGS. 9 and 10 illustrate a correcting device 100E, which is still another modification of the correcting device shown in FIG. 1. More specifically, a gas pipe 110E is formed so that the reticle stage 24 is accommodated in a recess 119 formed in a bottom surface 118E (reticle table), and so that the top surface of the reticle stage 24 and the top surface of the other portions of the bottom surface 118E are at the same height. A cross-sectional area $A_1$ of an area 112E and a cross-sectional area $A_2$ of an area 114E, both of which are illustrated in FIG. 9, are defined by a stepped portion of a top surface 116E of the gas pipe 110.

The correcting device 100E further comprises a control section 140, a memory 142, and a pressure sensor 150. The blowing section 120, the control section 140, the memory 142, and the pressure sensor 150 form a (feedback) control system. In this modification, the control section 140 causes the difference in pressure between the front and back surfaces of the reticle 20 to be detected through the pressure sensor 150 in order to control the blowing section 120 (or a driver (not shown) of the blowing section 120) so that the pressure difference becomes a predetermined value (for example, so that it becomes a value required to cancel the deformation of the reticle 20 caused by its own weight due to gravity, or, more specifically, so that it satisfies $P_1-P_2=0.5\cdot\rho\cdot V_1^2\{(A_1/A_2)^2-1\}=-G/A_R$. Therefore, the correcting device 100E can correct the distortion of the reticle caused by its own weight.

The control section 140 is connected to the pressure sensor 150 in order to control, for example, the blast volume, and the gas speed and the gas temperature at the blowing section 120 based on the detection results of the pressure sensor 150. The control section 140 is also connected to the memory 142, so that the memory 142 can store the method of controlling the blowing section 120 carried out by the control section 140 and/or the data used for the method. The memory 142 may be a read-only memory (ROM), a random-access memory (RAM), other such storage devices. In this modification, the control section 140 is a control section of the exposure apparatus 1. However, if necessary, this control section 140 may be a control section of an external device, the illumination device 10, and the projection optical system 30. In addition, separate control sections may be provided for these component parts.

The pressure sensor 150 comprises a sensor 152, disposed at the front side of the reticle 20 inside a gas flow path 111E, and a sensor 154, disposed at the back side of the reticle 20 below a bottom surface 118E of the gas pipe 110E. For the pressure sensor 150, sensors of any structure known in the industrial field, such as a strain gauge, a load cell, a piezoelectric device, a pressure electrically conductive sheet, a pressure sensitive polymer, a photodiode, an electrostatic capacitive (differential pressure) sensor, a Bourdon tube, a bellows, a diaphragm, or a torsion bar may be used. The structures and operations of these types of sensors are well known, and will not be described in detail below.

Figure 11:
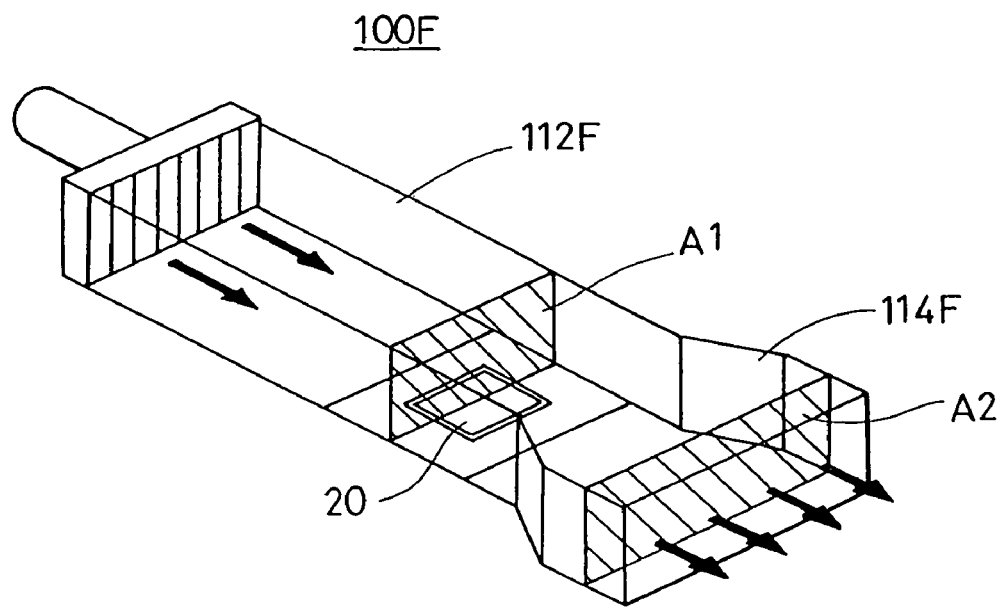
FIG. 11 is a perspective view of still another modification of the correcting device shown in FIG. 1.

FIG. 11 is an external perspective view of a correcting device 100F, which is still another modification of the correcting device 100 shown in FIG. 1. The correcting device 100F is similar to the correcting device 100E, but differs from it in that, unlike the area 114E that spreads vertically with respect to the area 112E, an area 114F spreads towards the left and right with respect to an area 112F. In other words, a top surface 116F of a gas flow path 110F (not shown) is maintained horizontally with respect to the areas 112F and 114F. By combining the structures shown in FIGS. 9 and 11, the area 114F may spread in the upward and downward directions and towards the left and right with respect to the area 112F.

Figure 12:
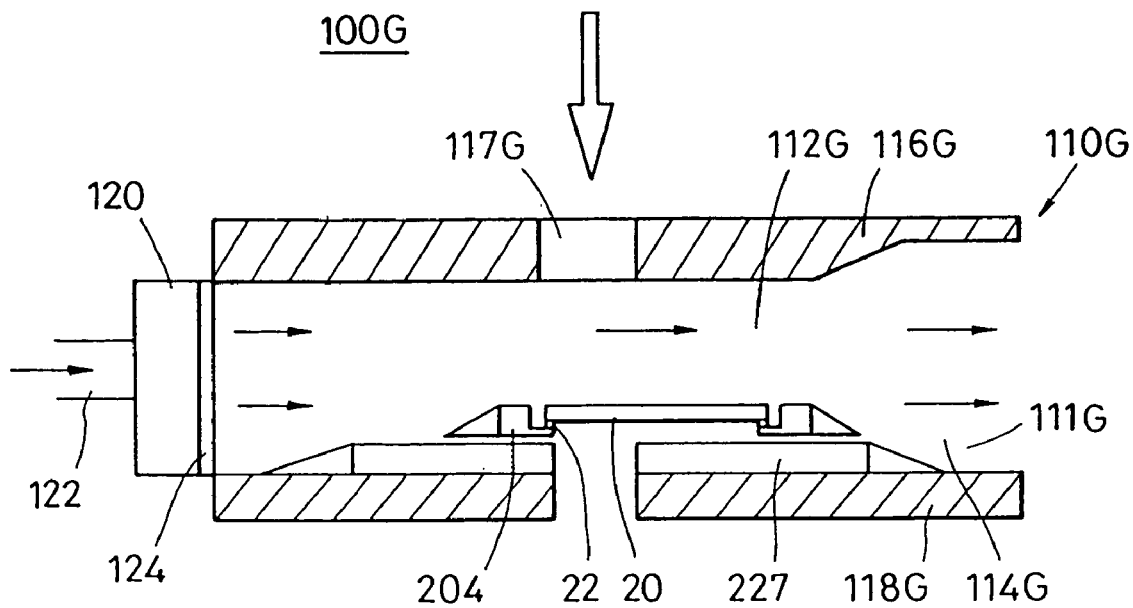
FIG. 12 is a sectional view of still another modification of the exposure apparatus and of the correcting device shown in FIG. 1.
Figure 13:
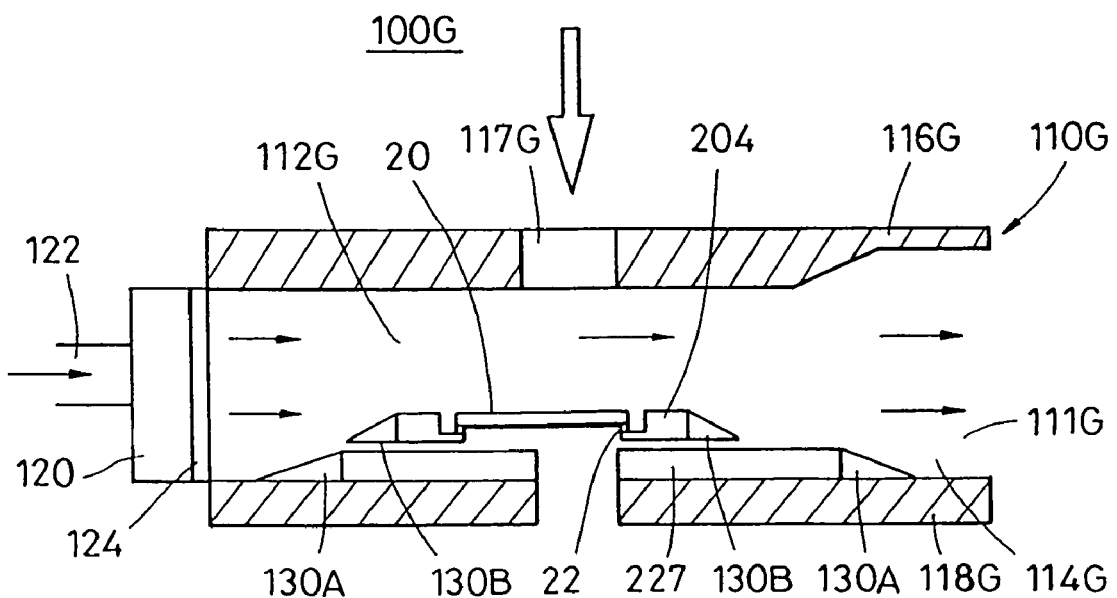
FIG. 13 is a sectional view showing a state in which the reticle has moved in the sectional view of FIG. 12.

In the present invention, it does not matter what scanning method is used on the reticle 20, so that, for example, as shown in FIGS. 12 to 15, the present invention may be applied to a scanning exposure apparatus 200. Referring to FIGS. 12 and 13, the correcting device 100F is used with the reticle 20 that is scanned in synchronism by a pair of linear motors 204 and 227, which can move perpendicular to each other. FIG. 13 shows a state in which the reticle 20 has moved towards the left from its position shown in FIG. 12.

Figure 14:
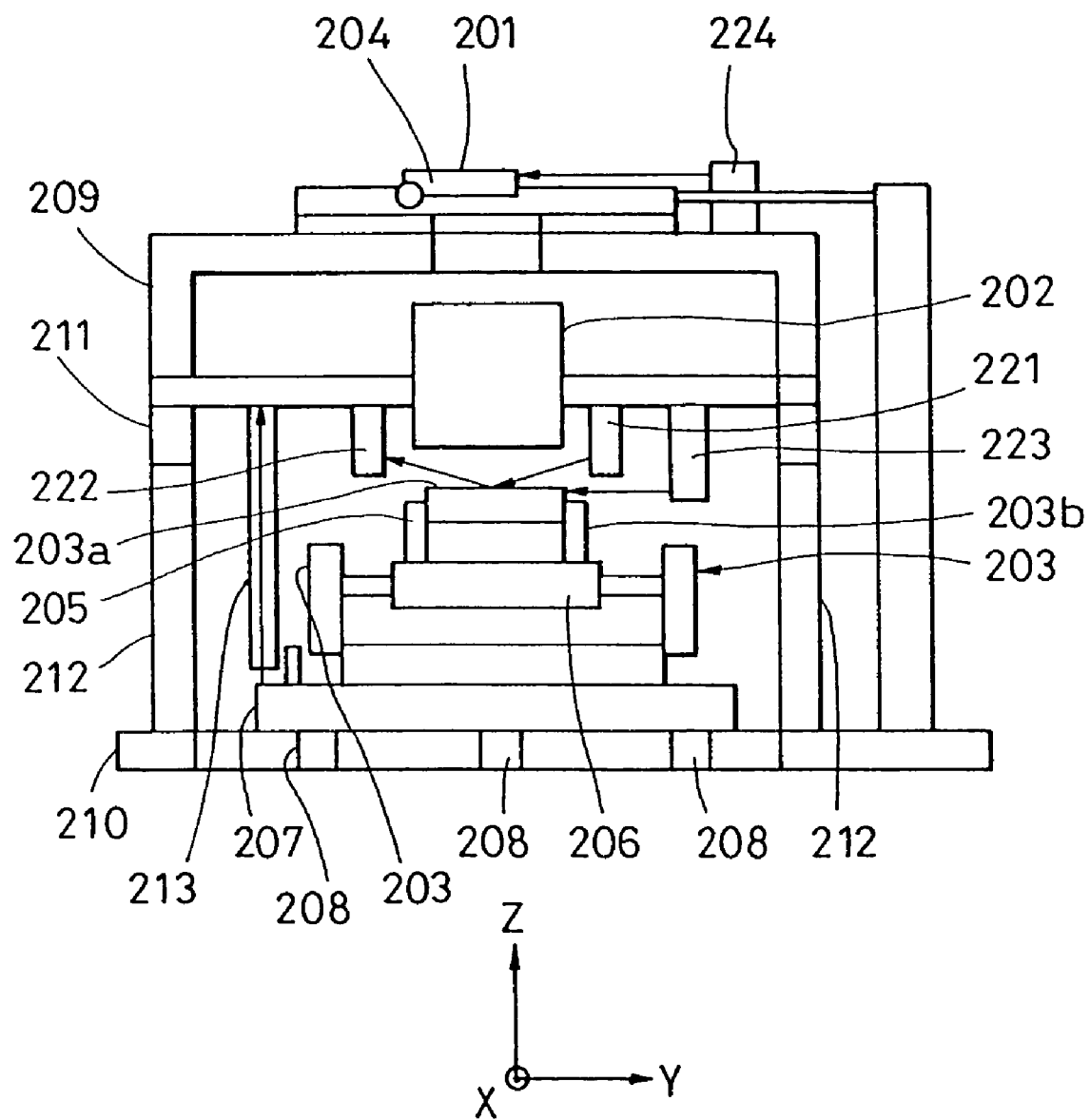
FIG. 14 is a schematic, side view of the exposure apparatus shown in FIGS. 12 and 13.
Figure 15:
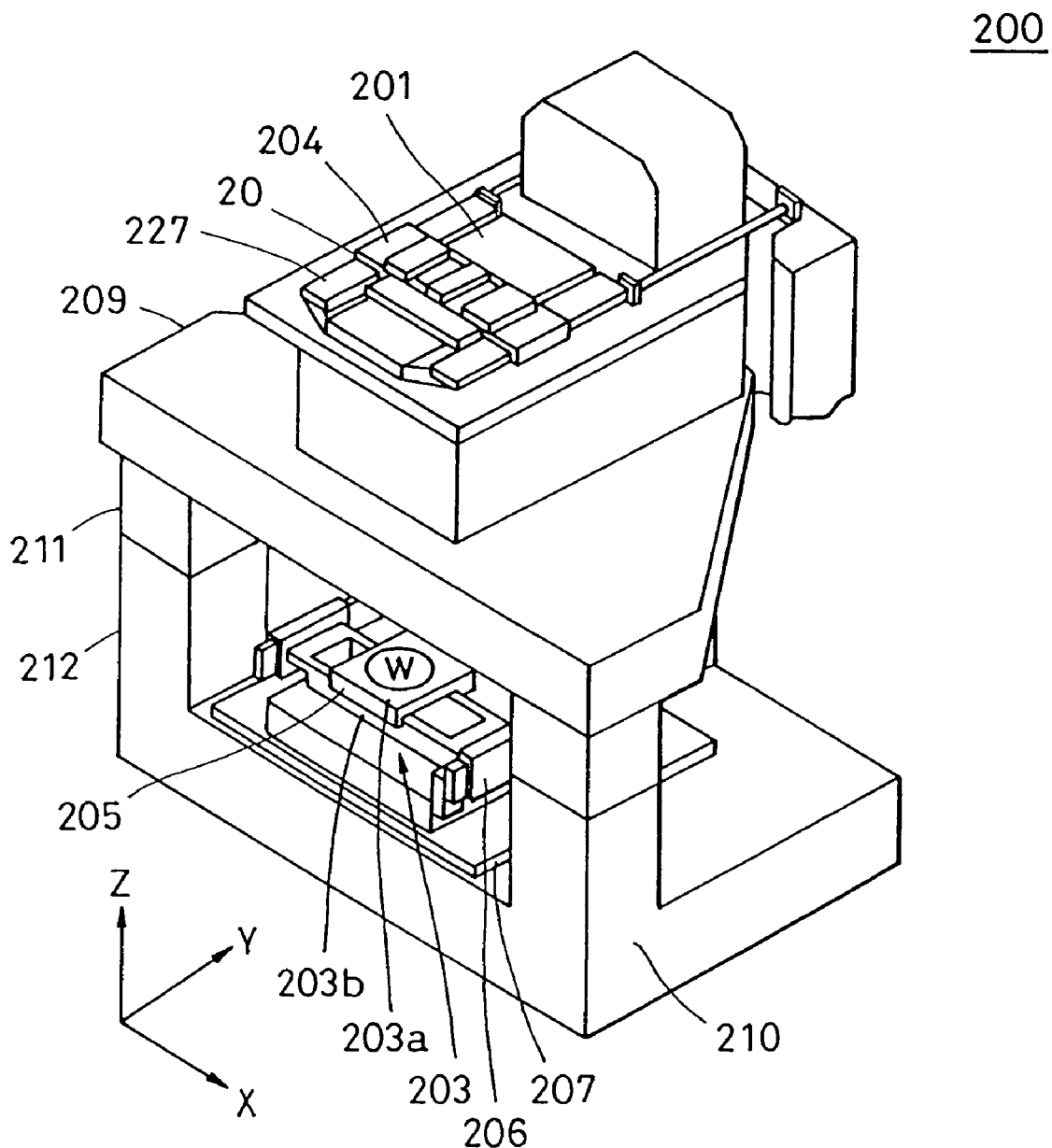
FIG. 15 is an external perspective view of the exposure apparatus shown in FIG. 14.

Hereafter, with reference to FIGS. 14 and 15, the exposure apparatus 200 will be described. FIG. 14 is a schematic side view of the exposure apparatus 200, and FIG. 15 is an external perspective view of the exposure apparatus 200. Through a projection optical system 202, the exposure apparatus 200 projects a portion of the circuit pattern of the reticle 20 disposed on a reticle stage 201, which holds the reticle 20 and which can be used for performing a scanning operation in the Y direction, onto a wafer W disposed on an XY stage 203. The exposure apparatus 200 is a step-and-scan exposure apparatus which is used to project the pattern of the reticle 20 onto the wafer W by exposure as a result of scanning the reticle 20 and the wafer W in the Y direction in synchronism with each other with respect to the projection optical system 202 and which interposes stepwise movements in order to apply scanning exposure light to a plurality of shots on the wafer W.

The reticle stage 201 is driven in the Y direction by the linear motors 204 and 227. An X stage 203a of the wafer stage 203 is constructed so that it is driven in the X direction by a linear motor 205, and a Y stage 203b is constructed so that it is driven in the Y direction by a linear motor 206. The synchronized scanning operation of the reticle 20 and the wafer W is carried out by driving the reticle stage 201 and the Y stage 203b in the Y direction at a fixed speed ratio (for example, 4:−1, where the − sign means opposite direction) while laser interferometers 222 and 223 monitor the locations of the reticle stage 201 and the Y stage 203b in the Y direction. The wafer W is moved stepwise in the X direction by the X stage 203a.

The wafer stage 203 is provided on a stage table 207, which is supported on, for example, the floor at three points through three dampers 208. The reticle stage 201 and the projection optical system 202 are provided on a telescopic surface plate 209, which is supported through three dampers 211 and column supports 212 on a base frame 210 disposed on, for example, the floor. Although the dampers 203 are active dampers that actively deaden or isolate vibration in six axial directions, they may be passive dampers. In addition, dampers do not need to be used to support the telescopic surface plate 209.

At three points between the telescopic surface plate 209 and the stage table 207, the exposure apparatus 200 includes distance-measuring means, such as measurement laser interferometers or microcomputers. Light projecting means 221 and light-receiving means 222 form a focus sensor for detecting whether or not the wafer W on the wafer stage 203 is positioned at a focal plane of the projection optical system 202. More specifically, the light-projecting means 221, secured to the telescopic surface plate 209, projects light onto the wafer W from an oblique direction, and the light-receiving means 222 detects the location of the reflected light in order to detect the location of the surface of the wafer W in the optical axis direction of the projection optical system 202.

In the structure, transporting means (not shown) transports the wafer W onto the wafer stage 203 via a transportation path between the two column supports 212 at the front portion of the exposure apparatus 200. When a predetermined alignment is completed, the exposure apparatus 200 transfers the pattern of the reticle 20 onto a plurality of exposure areas of the wafer W by exposure while it repeats scanning exposure operations and causes stepwise movements to be repeated. In the scanning exposure operation, the reticle stage 201 and the Y stage 203b are moved at a predetermined speed ratio in the Y direction (scanning direction). Using slit-shaped exposure light, the pattern on the reticle 20 is scanned, and the wafer W is scanned using the projection image of the pattern in order to project the pattern of the reticle 20 onto a predetermined exposure area of the wafer W by exposure. During the scanning exposure operation, the height of the surface of the wafer W is measured by the focus sensor. Based on the measured value, the height and tilt of the wafer stage 203 are controlled in real time in order to correct the focus. After completion of a scanning exposure operation on one exposure area, by driving the X stage 203a in the X direction in order to move the wafer W stepwise, another exposure area is positioned at a scanning exposure starting location and is, then, subjected to scanning exposure. By combining the stepwise movements in the X direction and the movements for performing scanning exposure in the Y direction, in order to allow the exposure operations to be successively performed efficiently with respect to the plurality of exposure areas on the wafer W, the location of each of the exposure areas, scanning in the +Y or −Y direction, the order in which each exposure area is exposed, and the like, are set.

In the exposure apparatus 200 shown in FIG. 14, light that has been emitted from a laser interferometer light source (not shown) is caused to enter the Y-direction laser interferometer 224. The light that has entered the Y-direction laser interferometer 224 is divided by a beam splitter (not shown) inside the laser interferometer 224 into light that is directed towards a fixed mirror (not shown) disposed inside the laser interferometer 224 and light that is directed towards a Y-direction moving mirror (not shown). The light that is directed towards the Y-direction moving mirror passes through a Y-direction length measurement optical path (not shown), and, then, impinges upon the Y-direction moving mirror secured to the reticle stage 201. Here, the light that is reflected passes again through the Y-direction length measurement optical path, returns to the beam splitter inside the laser interferometer 202, and is superimposed on the light reflected at the fixed mirror. At this time, by detecting changes in the interference of light, the distance of movement in the Y direction is measured. The information regarding the distance of movement measured in this way is fed back to a scanning control device (not shown), which controls the positioning operation of a scanning location of the reticle stage 201.

Figure 16:
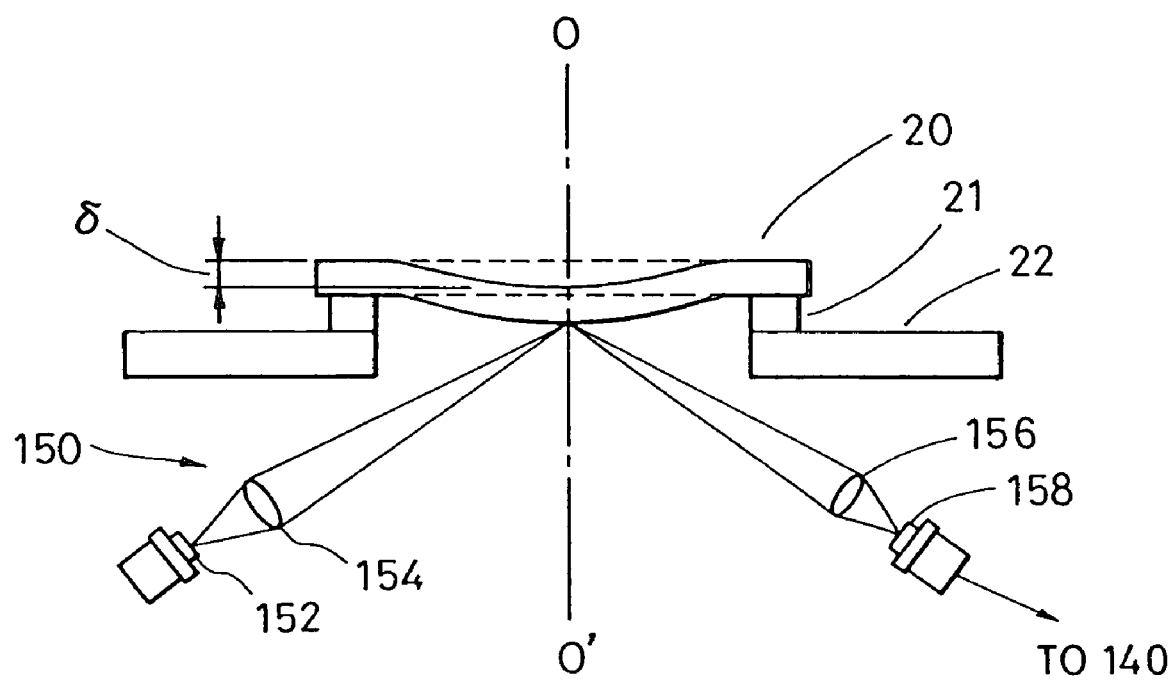
FIG. 16 is a schematic block diagram of a detecting section that detects distortion of the reticle used in the exposure apparatus shown in FIG. 1.

The reticle 20 is deformed as a result of being heated by the exposure light from the illumination device 10. In the present invention, it is possible to correct both thermal deformation of the reticle 20 and flexure of the reticle 20 caused by its own weight. Hereafter, an example of correcting the deformations of the reticle 20 will be given with reference to FIG. 16. FIG. 16 is a schematic block diagram of a detecting section 150 that detects any distortion of the reticle 20. The reticle 20 is secured to the reticle chuck 22 through a suction pad 21. The reticle 20 is distorted by a flexure amount δ caused by its own weight, heat, and other factors. The detecting section 150 comprises a light-emitting section 152, lenses 154 and 156, and a light-receiving section 158. In this example, the light-emitting section 152 and the light-receiving section 158 form a light-reflective photo-interrupter. A light-emitting diode (LED), a laser diode (LA), or the like may be used for the light-emitting section 152. A photodiode, phototransistor, a photo IC, or the like may be used for the light-receiving section 158. The light-emitting section 152 illuminates a pattern formed on the surface of the reticle 20. Light reflected therefrom is detected by the light-receiving section 158 in order to detect the flexure amount δ of the reticle 20. The detection results provided by the light-receiving section 158 is transmitted to, for example, the control section 140 shown in FIG. 10. The control section 140 makes use of such results to control the blowing section 120. The control section 140 controls feedback of the blowing section 120 so that the flexure amount δ of the reticle 20 becomes zero in order to correct the distortions of the reticle 20.

In the exposure, light beams emitted from the light source 12 are used to subject the recticle 20 to, for example, Koehler illumination by the illumination optical system 14. Since the exposure apparatus 1 makes it possible to reduce or remove the distortions of the reticle 20, the pattern of the reticle 20 can be transferred onto the resist with high precision, so that a high-quality device (such as a semiconductor device, a liquid crystal display (LCD) device, an image pickup device (including a charge-coupled device (CCD)), and a thin-film magnetic head) can be provided.

Figure 17:
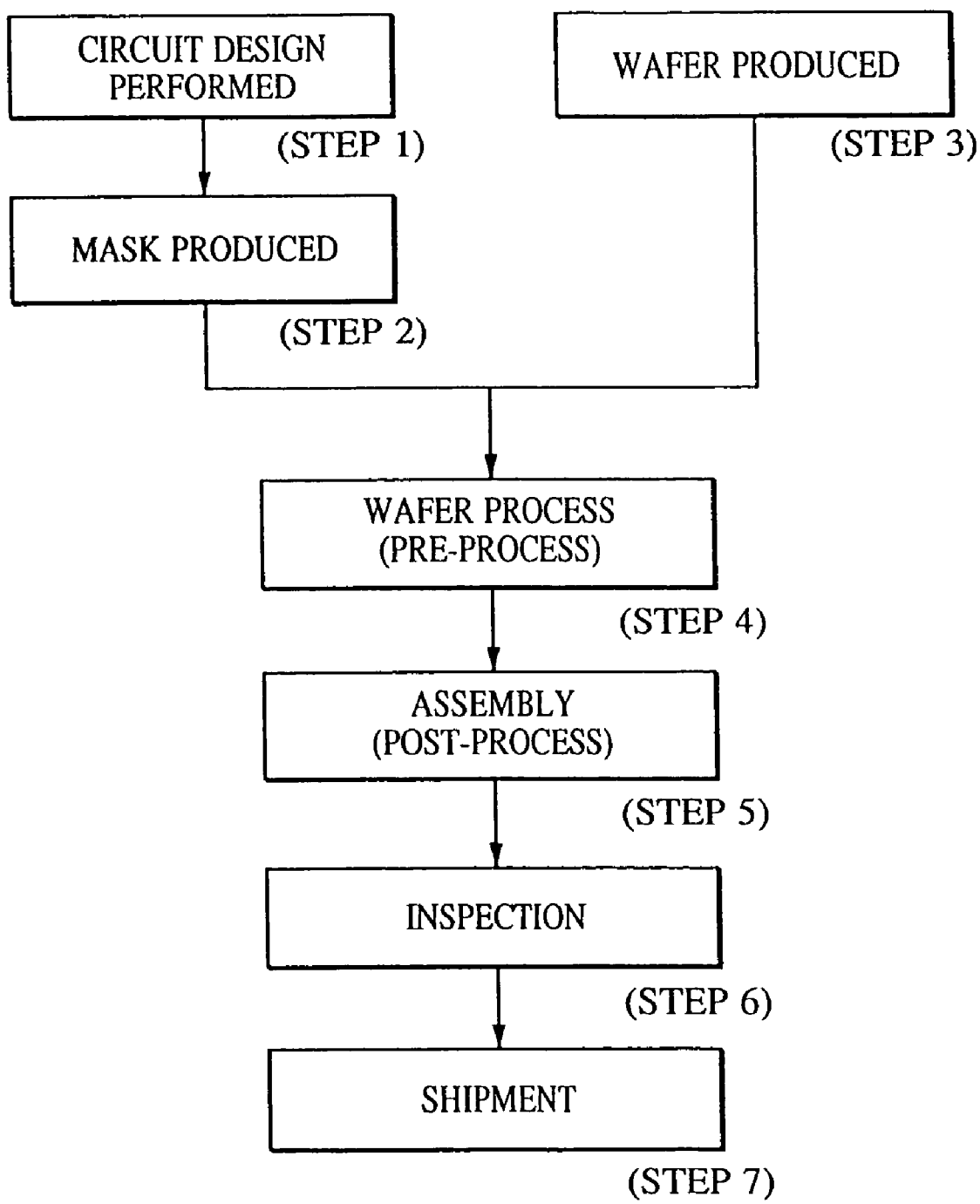
FIG. 17 is a flowchart used to illustrate a device production method including an exposure step in accordance with the present invention.
Figure 18:
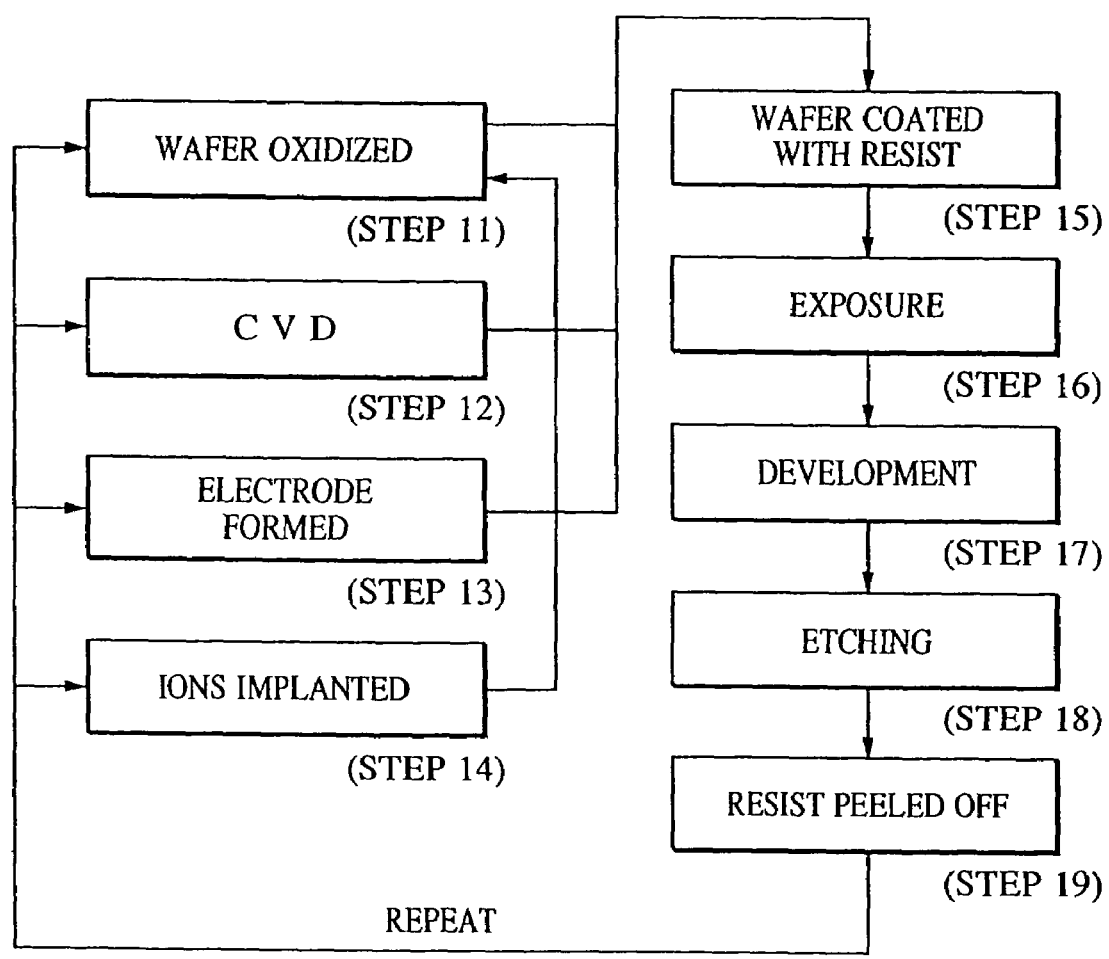
FIG. 18 is a detailed flowchart of Step 4 shown in FIG. 17.

Referring to FIGS. 17 and 18, an embodiment of a device production method using the above-described exposure apparatus 1 will be described. FIG. 17 is a flowchart used to illustrate the production of a device (such as a semiconductor chip of, for example, an integrated circuit (IC) or a large-scale integrated circuit (LSI), an LCD, and a CCD). Here, an example of producing a semiconductor chip will be described. In Step 1, a circuit pattern is designed for the device. In Step 2, a mask having the designed circuit pattern formed thereon is produced. In Step 3, a wafer is produced, using silicon or other materials. In Step 4 (wafer process or pre-processing step), the mask and the wafer are used to actually form the circuit on the wafer using lithography techniques. Then, in the following step, Step 5, (post-processing step), the wafer produced in Step 4 is formed into a semiconductor chip, wherein assembly (dicing, bonding), packaging (of the chip), and the like are performed. In Step 6, the semiconductor device produced in Step 5 is inspected by conducting operation confirmation tests, durability tests, and the like. Thereafter, in Step 7, the finished semiconductor device is shipped.

FIG. 18 is a detailed flowchart of Step 4 (the wafer process). In Step 11, the surface of the wafer is oxidized. Then, in Step 12 (chemical-vapor deposition (CVD) step), an insulation film is formed on the wafer surface. In Step 13, an electrode is formed on the wafer by, for example, evaporation. In Step 14, ions are implanted into the wafer. In Step 15, a photosensitization agent is coated onto the wafer. In Step 16, the mask circuit pattern is printed onto the wafer by exposure using the exposure apparatus 1. In Step 17, the exposed portion of the wafer is developed. In Step 18, portions other than where the developed resist image is formed are etched. In Step 19, unwanted resist is removed from the wafer after etching. Multiple circuit patterns are formed on the wafer by repeating the above-described steps. By virtue of this embodiment of the device production method, devices having a higher quality than conventional devices can be produced.

Except as otherwise discussed herein, the various components shown in outline or in block form in the Figures are individually well known and their internal construction and operation are not critical either to the making or using or to a description of the best mode of the invention.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A correcting device comprising:
   a gas flow path including a first area and a second area, the first area being formed above a reticle having formed thereon a pattern that is projected onto a material to be processed in order to form an image of the pattern on the material to be processed, and the second area being connected to the first area, having a cross-sectional area that is different from that of the first area, and not being disposed in line with the reticle; and
   a blowing section that blows gas to the gas flow path,
   wherein the distortion of said reticle is corrected by causing the differential pressure between the first area and the second area.

2. A correcting device according to claim 1, wherein the second area is located downstream from the first area in terms of the gas flow of the gas flow path, and the cross-sectional area of the first area is smaller than the cross-sectional area of the second area.

3. A correcting device according to claim 1, further comprising a smoothing section, disposed between the first and second area, for smoothing movement of the gas between the first and second areas.

4. A correcting device according to claim 1, wherein the gas flow path is disposed opposite to the material to be processed, in terms of the reticle.

5. A correcting device according to claim 1, further comprising a control section that controls the blowing section so that, when the density of the gas is ρ, the weight of the reticle is G, the area of projection of the reticle is $A_R$, the cross sectional area of the first area is $A_1$, the pressure of the gas in the first area is $P_1$, the velocity is $V_1$, the cross-sectional area of the second area is $A_2$, and the pressure of the gas in the second area is $P_2$, the following formula is satisfied:

$$P_1-P_2=0.5 \cdot \rho \cdot V_1^2 \cdot \{(A_1/A_2)^2-1\}=-G/A_R.$$

6. A correcting device according to claim 2, wherein said gas flow path includes a third area provided upstream from the first area in terms of the gas flow of the gas flow path, and the cross-sectional area of the third area is greater than the cross-sectional area of the first area.

7. A correcting device according to claim 5, wherein said control section controls the speed of the gas blown by said blowing section.

8. A correcting device according to claim 5, wherein $P_2$ is atmospheric pressure.

9. A correcting device according to claim 5, wherein said control section controls the temperature of the gas flown by said blowing section.

10. A correcting device comprising:
   a blowing section that blows gas onto a reticle having formed thereon a pattern to be projected onto a material to be processed;
   a detecting section that detects pressure at front and back surfaces of the reticle and produces a detection result; and
   a control section that receives the detection result and controls the blowing section so that a difference between the pressure is maintained to be a predetermined value, after receiving the detection result provided by the detecting section.

11. A correcting device according to claim 10, wherein said control section controls the speed of the gas blown by said blowing section.

12. A correcting device according to claim 10, wherein the predetermined amount is determined in accordance with the self-weight of the reticle.

13. A correcting device according to claim 10, wherein said control section controls the temperature of the gas blown by said blowing section.

14. A correcting device comprising:
   a blowing section that blows gas onto a reticle having formed thereon a pattern to be projected onto a material to be processed;
   a detecting section that detects a flexure amount of the reticle and produces a detection result; and
   a control section that receives the detection result and controls the blowing section so that the flexure amount is maintained to be zero, after receiving the detection result provided by said detecting section.

15. A correcting device according to claim 14, wherein said control section controls the speed of the gas blown by said blowing section.

16. A correcting device according to claim 14, wherein said control section controls the temperature of the gas blown by the blowing section.

17. A device comprising:
   a chip formed by dicing the material processed by the production method comprising the steps of:
      blowing gas to a gas flow path including a first area and a second area, the first area being formed above a reticle having formed thereon a pattern that is projected onto a material to be processed in order to form an image of the pattern on the material to be processed, and the second area being connected to the first area, having a cross-sectional area that is different from that of the first area, and not being disposed in line with the reticle,
      subjecting the material to be processed to a projection exposure operation using the reticle, and
      performing a predetermined processing operation on the material that has been subjected to the projection exposure operation to produce a device; and
   a package for the chip.

18. A device comprising:
   a chip formed by dicing the material processed by the production method comprising the steps of:
      blowing gas to a gas flow path including a first area and a second area, the first area being formed above a reticle having formed thereon a pattern that is projected onto a material to be processed in order to form an image of the pattern on the material to be processed, and the second area being connected to the first area, having a cross-sectional area that is different from that of the first area, and not being disposed in line with the reticle,
      subjecting the material to be processed to a projection exposure operation using the reticle,
      performing a predetermined processing operation on the material that has been subjected to the projection exposure operation to produce a device, and
      detecting distortion of the reticle and controlling the step of blowing gas so that distortion of the reticle is reduced based on the detection of the distortion of the reticle; and
   a package for the chip.

* * * * *

UNITED STATES PATENT AND TRADEMARK OFFICE
CERTIFICATE OF CORRECTION

PATENT NO. : 7,138,282 B2
APPLICATION NO. : 11/125082
DATED : November 21, 2006
INVENTOR(S) : Nobuyoshi Tanaka et al.

It is certified that error appears in the above-identified patent and that said Letters Patent is hereby corrected as shown below:

COLUMN 3:
    Line 66, "p," should read -- $\rho$,--.

COLUMN 7:
    Line 9, "aberration-needs" should read -- aberration needs --.

COLUMN 8:
    Line 35, "$P_1-P_2=0.5\times\rho\times V_1^2\times\{(A_1/A_2)^2-1\}+\rho g\times(Z_2-Z_1)$." should read
-- $P_1-P_2=0.5\times\rho\times V_1^2\times\{(A_1/A_2)^2-1\}+\rho\times g\times(Z_2-Z_1)$. --.

COLUMN 15:
    Line 14, "cross sectional" should read -- cross-sectional --.

COLUMN 16:
    Line 13, "the" should read -- said --.
    Line 15, "by the" should read -- by a --.
    Line 34, "by the" should read -- by a --.

Signed and Sealed this

Eleventh Day of September, 2007

JON W. DUDAS
*Director of the United States Patent and Trademark Office*